(12) United States Patent
Panella

(10) Patent No.: US 6,362,972 B1
(45) Date of Patent: Mar. 26, 2002

(54) CONTACTLESS INTERCONNECTION SYSTEM

(75) Inventor: Augusto P. Panella, Naperville, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/548,636

(22) Filed: Apr. 13, 2000

(51) Int. Cl.⁷ ............................. H05K 7/02; H05K 7/06
(52) U.S. Cl. ................... 361/760; 361/792; 361/793; 361/794; 174/256; 174/260; 257/710; 257/713; 439/67; 439/68
(58) Field of Search ............................. 361/760, 761, 361/762, 767, 796, 800, 718, 730, 748, 719, 764, 765, 734, 766, 780, 782, 792, 793, 794, 795; 439/68, 67; 257/710, 713, 724; 174/250, 255, 260, 256, 277, 258

(56) References Cited

U.S. PATENT DOCUMENTS

| | | |
|---|---|---|
| 3,585,368 A | 6/1971 | Nunamaker |
| 3,593,319 A | 7/1971 | Barber |
| 3,604,900 A | 9/1971 | Kalt |
| 3,621,478 A | 11/1971 | Johnson et al. ............... 333/10 |
| 3,629,733 A | 12/1971 | Podell ........................ 333/10 |
| 3,719,804 A | 3/1973 | Illing |
| 3,869,082 A | 3/1975 | Ludin |
| 3,974,332 A | 8/1976 | Abe et al. |
| 4,139,827 A | 2/1979 | Russell ..................... 3333/10 |
| 4,144,485 A | 3/1979 | Akita ......................... 323/44 |
| 4,145,624 A | 3/1979 | Upadhyayula ............. 307/299 |
| 4,280,119 A | 7/1981 | May |
| 4,480,178 A | 10/1984 | Miller, II et al. |
| 4,553,026 A | 11/1985 | Arlowe |
| 4,633,291 A | 12/1986 | Koyama |
| 4,634,847 A | 1/1987 | Jürgen |
| 4,700,152 A | 10/1987 | Wilson ....................... 333/24 |
| 4,752,680 A | 6/1988 | Larson |
| 4,763,340 A | 8/1988 | Yoneda et al. .............. 375/121 |
| 4,795,898 A | 1/1989 | Bernstein et al. |
| 4,798,322 A | 1/1989 | Bernstein et al. |
| 4,816,653 A | 3/1989 | Anderl et al. |
| 4,816,654 A | 3/1989 | Anderl et al. |
| 4,818,855 A | 4/1989 | Mongeon et al. |
| 4,835,373 A | 5/1989 | Adams et al. |
| 4,841,128 A | 6/1989 | Gröttrup et al. |
| 4,853,523 A | 8/1989 | Talmadge |
| 4,876,535 A | 10/1989 | Ballmer et al. ........ 340/825.34 |
| 4,918,416 A | 4/1990 | Walton et al. |
| 4,931,991 A | 6/1990 | Cvijanovich ................. 365/52 |
| 4,953,123 A | 8/1990 | Takeuchi et al. ............. 365/66 |
| 5,012,321 A | 4/1991 | Magarshack |

(List continued on next page.)

OTHER PUBLICATIONS

IBM Technical Disclosure Bulletin, Nonmechanical Connection Technique for High Speed, High Density Integrity Circuit Application, Jan., 1968.

IBM Technical Disclosure Bulletin, Cross Talk Coupled Transmission Line Driver, Mar. 1972.

IBM Technical Disclosure Bulletin, Capacitive Coupled Connector, Jul., 1975.

(List continued on next page.)

Primary Examiner—Jeffrey Gaffin
Assistant Examiner—Hung Bui
(74) Attorney, Agent, or Firm—Charles S. Cohen; Thomas D. Paulius

(57) ABSTRACT

A contactless interconnecting system is provided between a computer chip package and a circuit board. The system includes a computer chip package having a silicon wafer mounted on a support structure which includes a wall with a substantially planar upper surface. The wall is fabricated of a dielectric material. A pattern of discrete terminal lands are disposed on the upper surface of the wall and are electrically coupled to the silicon wafer. A circuit board is juxtaposed below the wall of the chip package and includes a substantially planar upper surface having a pattern of discrete circuit pads aligned with the terminal lands.

7 Claims, 1 Drawing Sheet

U.S. PATENT DOCUMENTS

| | | | |
|---|---|---|---|
| 5,021,767 A | | 6/1991 | Fockens et al. |
| 5,027,191 A | * | 6/1991 | Bourdelaise et al. .......... 357/74 |
| 5,073,761 A | | 12/1991 | Waterman et al. ......... 333/24 C |
| 5,148,263 A | | 9/1992 | Hamai ........................... 23/48 |
| 5,159,181 A | | 10/1992 | Bartels et al. |
| 5,175,418 A | | 12/1992 | Tanaka |
| 5,212,402 A | | 5/1993 | Higgins, III |
| 5,229,652 A | | 7/1993 | Hough ....................... 307/104 |
| 5,266,821 A | | 11/1993 | Chern et al. |
| 5,309,324 A | * | 5/1994 | Herandez et al. ........... 361/734 |
| 5,324,205 A | | 6/1994 | Ahmad et al. ................ 439/66 |
| 5,378,887 A | | 1/1995 | Kobayashi |
| 5,435,733 A | * | 7/1995 | Chernicky et al. ............ 439/68 |
| 5,451,763 A | | 9/1995 | Pickett et al. |
| 5,471,040 A | | 11/1995 | May |
| 5,532,658 A | | 7/1996 | Tonegawa et al. |
| 5,572,441 A | | 11/1996 | Boie .......................... 364/514 |
| 5,579,207 A | * | 11/1996 | Hayden et al. ............. 361/790 |
| 5,583,378 A | * | 12/1996 | Marrs et al. ................ 257/710 |
| 5,589,709 A | | 12/1996 | Dobkin et al. |
| 5,593,322 A | | 1/1997 | Swamy et al. .............. 439/660 |
| 5,594,233 A | | 1/1997 | Kenneth et al. |
| 5,598,029 A | | 1/1997 | Suzuki |
| 5,598,032 A | | 1/1997 | Fidalgo |
| 5,629,838 A | | 5/1997 | Knight et al. ............... 361/782 |
| 5,640,306 A | | 6/1997 | Gaumet et al. ............. 361/737 |
| 5,652,423 A | | 7/1997 | Saitoh et al. |
| 5,668,399 A | | 9/1997 | Cronin et al. |
| 5,672,911 A | | 9/1997 | Patil et al. |
| 5,682,061 A | | 10/1997 | Khandros et al. .......... 257/666 |
| 5,701,032 A | * | 12/1997 | Fisher et al. ................ 257/692 |
| 5,701,037 A | | 12/1997 | Weber et al. |
| 5,706,174 A | | 1/1998 | Distefano et al. ........... 361/749 |
| 5,714,864 A | | 2/1998 | Rose et al. ..................... 320/2 |
| 5,771,157 A | * | 6/1998 | Zak ............................ 361/760 |
| 5,777,383 A | | 7/1998 | Stager et al. ............... 257/700 |
| 5,786,979 A | | 7/1998 | Douglass |
| 5,793,668 A | | 8/1998 | Krakovyak ................ 365/149 |
| 5,804,811 A | | 9/1998 | Saitoh et al. |
| 5,810,606 A | | 9/1998 | Ballast et al. |
| 5,818,112 A | | 10/1998 | Weber et al. |
| 5,834,832 A | | 11/1998 | Kweon et al. ................ 23/495 |
| 5,841,122 A | | 11/1998 | Kirchhoff |
| 5,847,447 A | | 12/1998 | Rozin et al. |
| 5,854,480 A | | 12/1998 | Noto |
| 5,856,710 A | | 1/1999 | Baughman et al. |
| 5,929,510 A | | 7/1999 | Geller et al. |
| 5,929,517 A | | 7/1999 | Distefano et al. ........... 257/707 |
| 5,936,841 A | | 8/1999 | Kantner et al. ............. 361/737 |
| 5,938,452 A | | 8/1999 | Wojnarowski ............... 439/67 |
| 5,938,479 A | | 8/1999 | Paulson et al. ............. 439/676 |
| 5,949,060 A | | 9/1999 | Schattschneider et al. |
| 5,949,155 A | | 9/1999 | Tamura et al. |
| 5,952,709 A | | 9/1999 | Kitazawa et al. ........... 257/664 |
| 5,965,867 A | | 10/1999 | Haghiri-Tehrani |
| 5,977,631 A | | 11/1999 | Notani |
| 5,977,841 A | | 11/1999 | Lee et al. |
| 6,001,211 A | | 12/1999 | Hiroyuki |
| 6,005,777 A | | 12/1999 | Bloom et al. |
| 6,028,497 A | | 2/2000 | Allen et al. |
| 6,049,463 A | | 4/2000 | O'Malley et al. |
| 6,057,600 A | | 5/2000 | Kitazawa et al. ........... 257/728 |
| 6,069,404 A | | 5/2000 | Aufinger et al. |
| 6,073,855 A | | 6/2000 | MacKenthun |
| 6,081,030 A | | 6/2000 | Jaouen et al. |
| 6,118,357 A | | 9/2000 | Tomasevic et al. |
| 6,124,625 A | | 9/2000 | Chern et al. |
| 6,124,636 A | | 9/2000 | Kusamitsu |
| 6,152,373 A | | 11/2000 | Roberts et al. |
| 6,173,897 B1 | | 1/2001 | Halpern |
| 6,191,479 B1 | | 2/2001 | Herrell et al. |

OTHER PUBLICATIONS

EDO Electro–Ceramic Products, Piezoelectric Ceramic Overview & Power Compositon Formulation.

Thomas D. Simon and Thomas F. Knight, Jr., M.I.T. Transit Project, Transit Note #57, A Fast Static Gate.

Lipeng Cao and J. Peter Krusius, School of Electrical Engineering, Cornell University, Smart Packages and Interconnect Substrates–Computing Functions Using Signal Line Coupling.

David B. Salzman, Ph.D., Polychip, Inc. and Thomas F. Knight, Jr. Ph.D., MIT Artificial Intelligence Laboratory, Capacitively Coupled Multichip Modules.

Thomas F. Knight, Jr., Ph.D., MIT Artificial Intelligence Laboratory and David B. Salzman, Polychip, Inc., Ph.D., Manufacturability of Capacitively Coupled Multichip Modules.

David Salzman, Ph.D., Poly Chip, Inc., Thomas Knight, Jr., Ph.D., Polychip, Inc. and MIT A.I. Lab and Paul Franzon, Ph.D., North Carolina State University, Application of Capacitive Coupling to Switch Fabrics.

J.S. Yuan and J.J. Liou, University of Central Florida, Parasitic Capacitance Effects.

Wally Meinel, Burr Brown Corporation, Plastic Molded Analog Isolation Amplifier.

Paul D. Franzon, Department of Electrical and Computer Engineering, North Carolina State University, Low–Power, High–Performance MEMS–based Switch Fabric.

A.D. Berard, J.J. Pitarra and J. R. Pivnichny, IBM, Jul. 1975, Capacitive Coupled Connector.

G.M. Krembs, IBM, Apr., 1971, Capacitive–Coupled Connectors for Gaseous Discharge Display Panels.

W.T. Pimbley, IBM, Jul. 1975, Magnetic Ink Container for supplying Constant Density Magnetic Ink.

Mitsuru Sekiguchi, Toyokazu Fujii and Michinari Yamanaka, Semiconductor Research Center, Matsuhita Electric Industries Co, Inc., Feb. 1996, Suppression of Resistance Increase in Annealed Al/W Interconnects by Capacitively Coupled Plasma Nitridation on W Surface.

* cited by examiner

CONTACTLESS INTERCONNECTION SYSTEM

FIELD OF THE INVENTION

This invention generally relates to the art of electrical connections and, particularly, to a contactless interconnecting system between a computer chip package and a circuit board.

BACKGROUND OF THE INVENTION

As semiconductor devices become more complex, the interconnections between the silicon wafer or "die" and appropriate circuit hardware continue to evolve and become more complex because of the difficulty of mechanical interconnections. This is due, in part, to the ever-increasing miniaturization and high density of electronic circuitry. Transmitted signals are becoming faster and faster (i.e., higher frequencies) and semi-conductor packages are becoming thinner and thinner (i.e., closely compacted). In some anticipated applications, it may be practically impossible to use conventional interconnecting systems, i.e., typical metal contacts or terminals.

Typical mechanical interconnecting systems incorporate conventional terminal pins and sockets or other male and female configurations or interengaging spring connections. With such traditional metal-to-metal interconnections, it is essential to provide a wiping action between the terminals or contacts to remove contaminants or oxidants. Unfortunately, miniaturized semi-conductor interconnections are so small that such traditional mechanical interconnecting systems are not possible. Even traditional solder connections are difficult if at all possible because of the extremely complex hard tooling required for use with miniaturized or closely spaced components of a semi-conductor interconnecting system. In some applications, it may be necessary to rely on electrical or magnetic field coupling as a possible alternative, and the present invention is directed to satisfying this need and solving the problems enumerated above.

SUMMARY OF THE INVENTION

An object, therefore, of the invention is to provide a new and improved contactless interconnecting system, particularly such a system between a computer chip package and a circuit board.

In the exemplary embodiment of the invention, the system includes a computer chip package having a silicon wafer or "die". A support structure mounts the wafer and includes a wall with a substantially planar upper surface and a substantially planar lower surface. The wall is fabricated of a material having a relatively high dielectric constant. A pattern of discrete terminal lands are provided on the upper surface of the wall and are electrically coupled to the silicon wafer. A circuit board is disposed below the wall of the computer chip package and includes a substantially planar upper surface having a pattern of discrete circuit pads aligned with the terminal lands.

As disclosed herein, the wall of the chip package comprises an exterior wall of a housing within which the silicon wafer is packaged. The wall may be fabricated of a material having a relatively high dielectric constant.

Other objects, features and advantages of the invention will be apparent from the following detailed description taken in connection with the accompanying drawings.

BRIEF DESCRIPTION OF THE DRAWING

The features of this invention which are believed to be novel are set forth with particularity in the appended claims. The invention, together with its objects and the advantages thereof, may be best understood by reference to the following description taken in conjunction with the accompanying drawing in which

DETAILED DESCRIPTION OF THE PREFERRED EMBODIMENT

Figure 1:
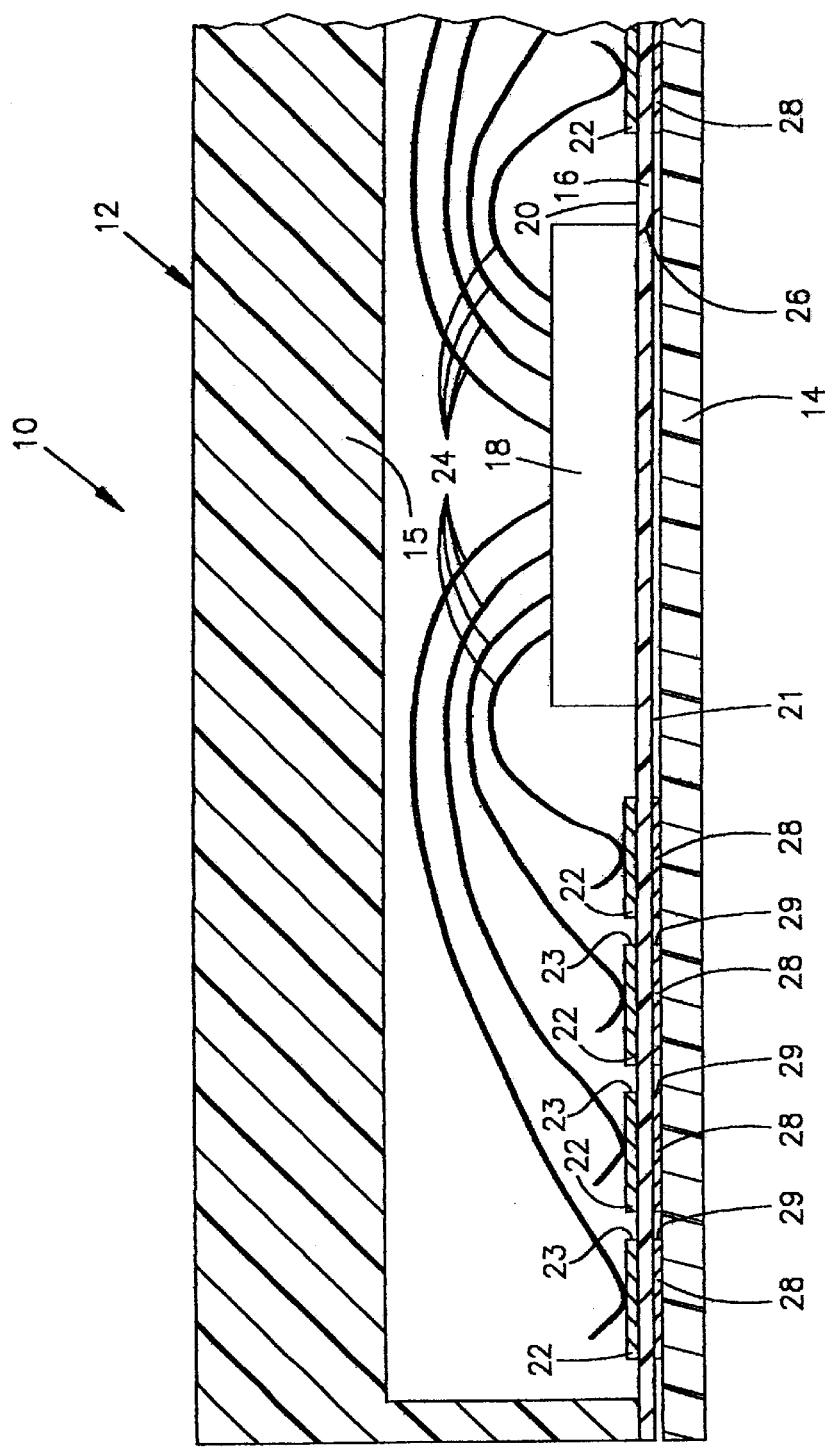
FIG. 1 is a fragmented vertical section through a contactless interconnecting system according to the invention.

Referring to the drawing in greater detail, the invention is embodied in a contactless interconnecting system, generally designated 10, between a computer chip package, generally designated 12, and a circuit board 14 or other substrate, such as a printed circuit board. As used herein and in the claims hereof, such terms as "upper", "lower", "top", "bottom", "vertical" and the like are not in any way intended to be limiting. Such terms are used only to provide a clear and concise description and understanding of the invention in view of the drawings. Obviously, the system herein is omni-directional in use and application.

Chip package 12 of system 10 includes a housing 15 having a bottom outside wall 16. A silicon wafer or "die" 18 is mounted on a substantially planar upper surface 20 of a wall 16, whereby the wall provides a support structure for the wafer. A pattern of discrete terminal lands 22 are provided on upper surface 20 of wall 16 and are electrically coupled to silicon wafer 18. The pattern of terminal lands define gaps 23 therebetween. The wall 16 also has a substantially planar lower surface 21.

Circuit board 14 of system 10 is disposed in a generally parallel relationship below wall 16 of chip package 12. The circuit board has a substantially planar upper surface 26 with a pattern of discrete circuit pads 28 aligned with terminal lands 22. The pattern of discrete circuit pads 28 also define spaces 29 therebetween similar to the gaps 23 defined by the pattern of discrete terminal lands 22. The circuit pads 28 are electrically connected to respective circuitry on the circuit board.

The invention contemplates that wall 16 of computer chip package 12 is disposed directly between terminal lands 22 of the chip package and circuit pads 28 of circuit board 14. In one embodiment, the lower surface 21 of the wall 16 mounts directly on the circuit pads 28. In another embodiment, the wall is fabricated of a material having a high dielectric constant relative to the material (e.g., air) filling the gaps 23 and spaces 29 to prevent cross coupling between adjacent terminal lands 22 and prevent cross coupling between adjacent circuit pads 28. In a further embodiment, the wall is fabricated of a material that has a dielectric constant of at least 200. Of course, a variety of materials or compositions could provide such a desired dielectric constant. However, as signal frequencies increase, the magnitude of the dielectric constant required of the wall 16 may decrease. In an additional embodiment, the thickness of the wall 16 should be thin relative to the width of gaps 23 between terminal lands 22 and spaces 29 between circuit pads 28 to promote coupling between aligned terminal lands 22 and circuit pads 28 and to prohibit cross coupling between adjacent terminal lands 22 or adjacent circuit pads 28.

It can be seen from the above, that a portion of the computer chip package (i.e., wall 16) is efficiently used to provide an electromagnetic coupling between silicon wafer 18 and circuit board 14. In essence, the wall 16 provides both a support structure as well as an interposing dielectric medium in a plurality of capacitors where terminal lands 22 and the circuit pads 28 act as half-capacitors on opposite sides of the interposing dielectric medium provided by wall 16. Signals are capacitively transferred between the terminal lands 22 of the chip package and the circuit pads 28 of the circuit board 14. Therefore, all other extraneous interconnecting components are eliminated, and the circuit board 14, along with circuit pads 28, can be interconnectingly mounted immediately adjacent the bottom surface of wall 16 of the chip package.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A contactless interconnecting system between a computer chip package and a circuit board, comprising:

a computer chip package including a silicon wafer; a support structure mounting the silicon wafer, the support structure including a wall with a substantially planar upper surface, the wall being fabricated of a dielectric material, a pattern of discrete conductive terminal lands disposed on the upper surface of said wall and electrically coupled to the silicon wafer; and, a circuit board positioned below said wall of the computer chip package, the circuit board including a substantially planar upper surface having a pattern of discrete, conductive circuit pads aligned with said chip package terminal lands, said circuit pads and terminal pads being separated from each other by said support structure wall and not being conductively connected.

2. The contactless interconnecting system of claim 1, wherein said support structure includes a housing within which the silicon wafer is packaged, and said wall defines an exterior wall of the housing.

3. The contactless interconnecting system of claim 1 wherein said wall is fabricated of a material having a dielectric constant of at least 200.

4. A contactless interconnecting system between a computer chip package and a circuit board, comprising:

a computer chip package including a housing having an exterior wall including a substantially planar inner surface, the wall being fabricated of a dielectric material, and a silicon wafer mounted in the housing, a pattern of discrete, conductive terminal lands on the interior surface of said wall and electrically coupled to the silicon wafer; and, a circuit board juxtaposed against the exterior of said wall, the circuit board including a substantially planar surface, said circuit board further including a pattern of discrete, conductive circuit pads disposed on a surface thereof that lies against said wall, the circuit pads being aligned with said terminal lands through the wall.

5. The contactless interconnecting system of claim 4 wherein said wall is fabricated of a material having a dielectric constant of at least 200.

6. A contactless interconnecting system between a computer chip package and a circuit board, comprising:

a computer chip package including a silicon wafer, a support structure mounting the silicon wafer and including a dielectric wall with a substantially planar upper surface and a lower surface, a pattern of discrete terminal lands disposed on the upper surface of said wall and electrically coupled to the silicon wafer; and, a circuit board below said wall of the computer chip package and including a substantially planar upper surface having a pattern of discrete circuit pads aligned with said terminal lands, said lower surface of said wall engaging said discrete circuit pads, said circuit pads and terminal lands being separated from each other by said dielectric wall and not being conductively connected together.

7. A contactless interconnecting system between a computer chip package and a circuit board, comprising:

a computer chip package including a silicon wafer, a support structure including at least one solid dielectric wall with a substantially planar upper surface, a pattern of discrete terminal lands disposed on the upper surface of said wall and electrically coupled to the silicon wafer; and, a circuit board below said wall of the computer chip package and including a substantially planar upper surface having a plurality of discrete circuit pads disposed thereon in a pattern matching that of said terminal lands so that said circuit pads are aligned with said terminal lands and separated therefrom by said dielectric wall.

* * * * *